United States Patent
Sakamoto et al.

(10) Patent No.: US 7,244,971 B2
(45) Date of Patent: Jul. 17, 2007

(54) SOLID STATE IMAGE PICKUP DEVICE

(75) Inventors: Tomohiro Sakamoto, Miyagi (JP); Yuko Nomura, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 24 days.

(21) Appl. No.: 10/848,359

(22) Filed: May 19, 2004

(65) Prior Publication Data
US 2004/0263657 A1   Dec. 30, 2004

(30) Foreign Application Priority Data
Jun. 27, 2003  (JP) ............................. 2003-184584

(51) Int. Cl.
*H01L 31/0328* (2006.01)
(52) U.S. Cl. ............... 257/184; 257/187; 257/222; 257/231; 257/258; 257/292; 257/462
(58) Field of Classification Search ................... None
See application file for complete search history.

(56) References Cited

U.S. PATENT DOCUMENTS 5,438,211 A * 8/1995 Nakamura et al. ............. 257/239
6,833,870 B1 * 12/2004 Nishi ............................ 348/294
2002/0027189 A1 * 3/2002 Murakami et al. ......... 250/208.1

FOREIGN PATENT DOCUMENTS

JP          10-335635         12/1998

* cited by examiner

*Primary Examiner*—Wai-Sing Louie
(74) *Attorney, Agent, or Firm*—Arent Fox LLP

(57) ABSTRACT

A solid state image pickup device comprising: a semiconductor substrate having a surface layer; charge storage regions disposed in the surface layer; vertical channels disposed in the surface layer adjacent to respective columns of the charge storage regions; vertical transfer electrodes formed above the semiconductor substrate, crossing the vertical channels; a horizontal channel disposed in the surface layer coupled to the vertical channels, having a first portion with transfer stages, each including a barrier region and a well region, and a second portion constituting a gate region with gradually decreasing width, and including an upstream region and a downstream region of different effective impurity concentration, establishing a built-in potential; horizontal transfer electrodes disposed above respective transfer stages of the horizontal channel; an output gate electrode disposed above the gate region; a floating diffusion region disposed in the surface layer coupled to the gate region of the horizontal channel.

21 Claims, 10 Drawing Sheets

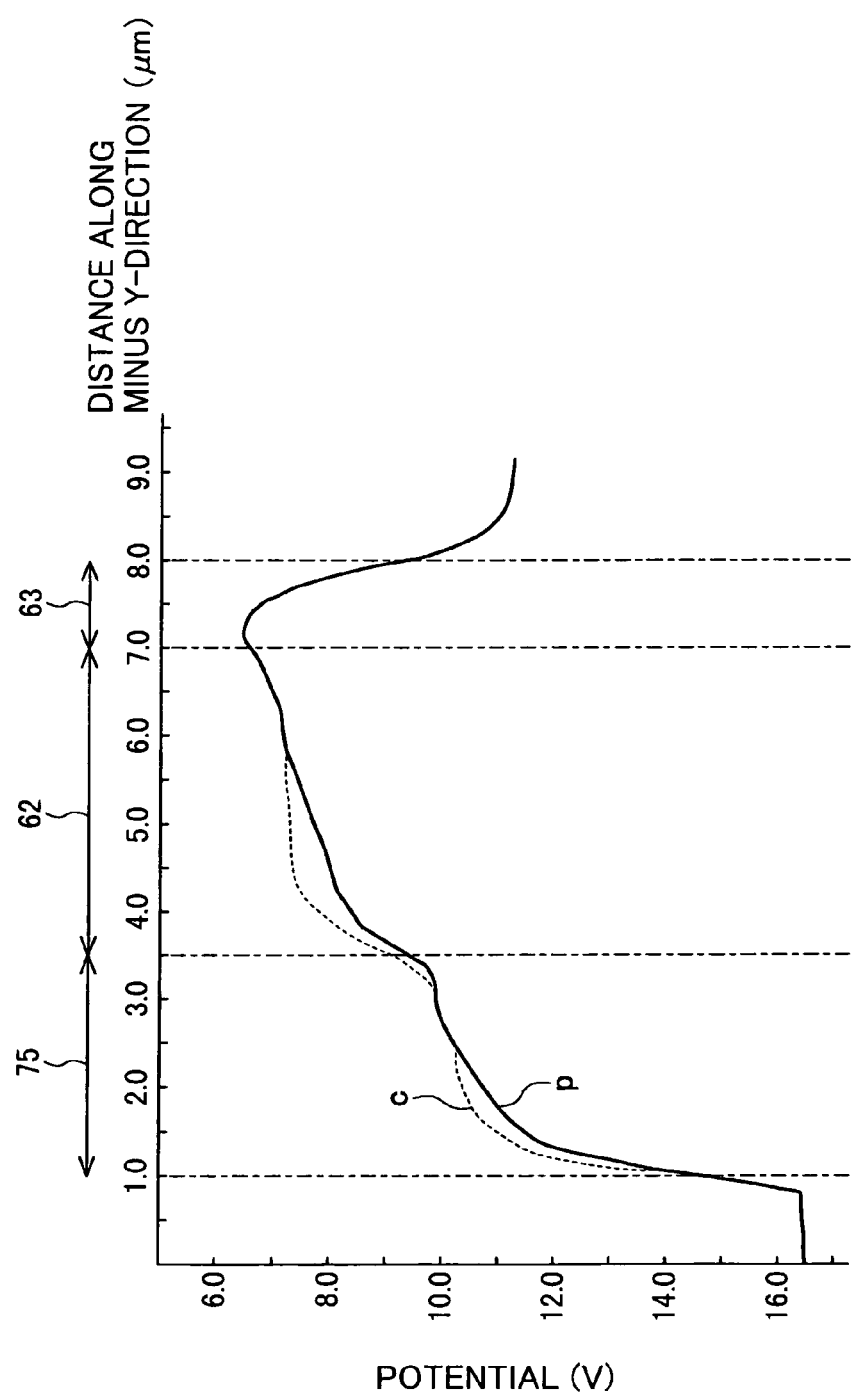

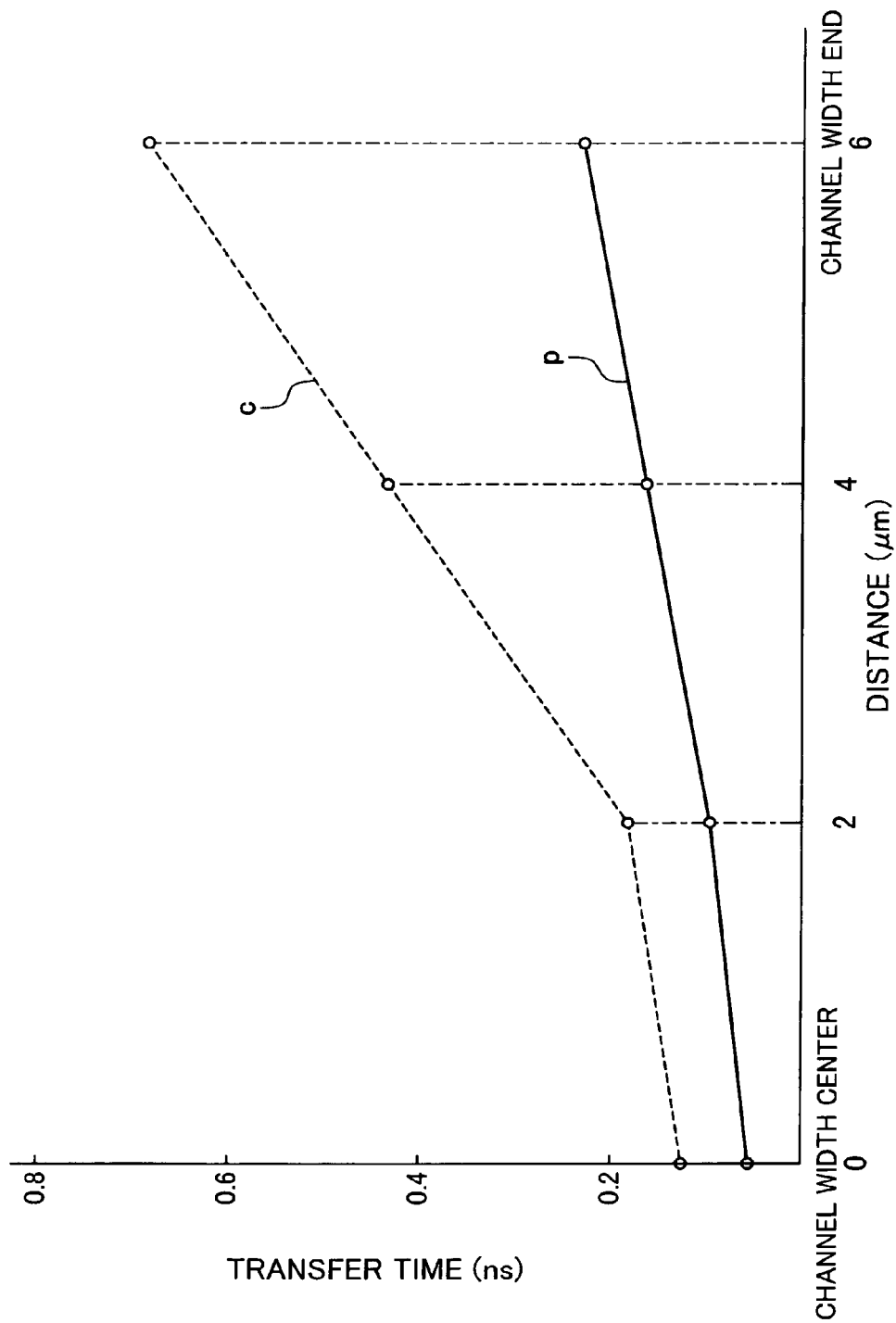

US 7,244,971 B2

SOLID STATE IMAGE PICKUP DEVICE

CROSS REFERENCE TO RELATED APPLICATION

This application is based on and claims priority of Japanese Patent Application No. 2003-184584 filed on Jun. 27, 2003, the entire contents of which are incorporated herein by reference.

BACKGROUND OF THE INVENTION

A) Field of the Invention

The present invention relates to a solid state image pickup device, and more particularly to a horizontal charge transfer path of the solid state image pickup device.

B) Description of the Related Art

FIG. 9 is a plan view showing the outline of a solid state image pickup device. The solid state image pickup device SI is constituted of: a plurality of photoelectric conversion elements 51 disposed in a matrix shape; a plurality of vertical charge transfer paths 53 each disposed near each column of photoelectric conversion elements; read regions 52 for reading signal charges generated in the photoelectric conversion elements 51 to each associated vertical charge transfer path 53, a line memory 54 formed at one ends of the vertical charge transfer paths 53 in the area outside the light reception area; a horizontal charge transfer path 55 electrically coupled to one ends of the plurality of vertical charge transfer paths 53 via the line memory 54; and an output amplifier 56 formed at one end of the horizontal charge transfer path 55, respectively formed on a semiconductor substrate. The photoelectric conversion element 51 is typically a photodiode, and the vertical and horizontal charge transfer paths 53 and 55 are typically charge coupled devices (CCDs).

Signal charges accumulated in the photoelectric conversion element 51 in correspondence with the amount of incident light are read to the vertical charge transfer path 53 via the read region 52, and thereafter transferred in the vertical charge transfer path 53 in the direction toward the horizontal charge transfer path 55. The vertical charge transfer path 53 has wiring lines V1A to V8 capable of four-phase drive and eight-phase drive, and transfers signal charges in response to transfer voltages (drive signals) applied via wirings 53a. The signal charges transferred to the end of the vertical charge transfer path 53 are stored once in the line memory 54, and then transferred to the horizontal charge transfer path 55. Signal charges of one line are transferred in the horizontal charge transfer path 55 in the horizontal direction and output as image signals from the output amplifier 56. The horizontal charge transfer path 55 transfers signal charges at high speed in response to two-phase drive signals φH1 and φH2 applied via wirings 55a.

FIG. 10A is a schematic plan view showing the structure of a horizontal charge transfer path 55 and an output region 57 of a conventional solid state image pickup device, and FIG. 10B is a cross sectional view taken along line 10B—10B shown in FIG. 10A.

As shown in FIG. 10A, the horizontal charge transfer path 55 is constituted of a horizontal charge transfer register 60 and an output gate 61. The horizontal charge transfer register 60 is constituted of a plurality of charge transfer stages 64, and transfers signal charges at high speed in the horizontal direction (Y-direction shown in FIG. 10A) in response to the transfer voltages (drive signals) φH1 and φH2. The signal charges are transferred in a horizontal charge transfer channel 65. Each transfer stage 64 includes a barrier region 63a on the upstream side and a well region 62a on the downstream side so that even if the signal charges are transferred by the two-phase drive signals, the signal charges can be prevented from being transferred in an opposite direction.

Of an n-type region surrounded by a two-dot chain line in FIG. 10A, a region in the horizontal charge transfer path 55 constitutes the horizontal charge transfer channel 65. On each transfer stage 64, a pair of a charge accumulation electrode 62 and a charge transfer electrode 63 is formed at the positions corresponding to the well region 62a and barrier region 63a respectively. The charge accumulation electrode 62 and charge transfer electrode 63 and the underlying horizontal charge transfer channel 65 constitute a charge coupled device. The horizontal charge transfer channel 65 at the last transfer stage 64 is coupled to a floating diffusion region 66 of the output region 57 via the output gate 61.

The output gate 61 is constituted of an output gate electrode 75 and the underlying horizontal charge transfer channel 65. A voltage VOG is applied to the output gate electrode 75 so that signal charges are transferred from the horizontal charge transfer channel 65 to the floating diffusion region 66. The signal charges transferred to the floating diffusion region 66 are subjected to charge-voltage conversion. The converted voltage signal is amplified by the output amplifier 56 to supply an output signal.

After the charge-voltage conversion of the signal charges transferred to the floating diffusion region 66, the signal charges are drained into a reset drain 69 via a reset gate 68. In order to drain the signal charges, a constant high reset voltage φRG is applied to the reset gate 68 via a reset gate electrode 67. The reset gate 68 is the region under the reset gate electrode 67 is the region surrounded by the two-dot chain line shown in FIG. 10A.

The horizontal charge transfer channel 65 has the structure that its width (length along the X-direction) is gradually narrowed toward the output region 57 in the region of the last transfer stage 64 of the horizontal charge transfer register 60 and the output gate 61. An output voltage of the floating diffusion region 66 is in inverse proportion with the capacitance. In order to obtain a high output voltage, it is desired to reduce the capacitance of the floating diffusion region 66, i.e., to reduce the area as viewed in plan. For example, the channel width (length of the horizontal charge transfer channel 65 in the X-direction) is narrowed from 20 to 40 μm to 1 to 3 μm. In order to transfer the same amount of signal charges in the narrow channel, it is desired to elongate the length of the last stage charge accumulation region 62.

The length (length in the Y-direction) of the electrode of the last transfer stage 64 of the horizontal charge transfer register 60 is, for example, 4.5 μm which is longer than the length (e.g., 3.8 μm) of the electrodes of the other transfer stages 64. For example, the length of the output gate electrode 75 is 3 μm.

As shown in FIG. 10B, in the horizontal charge transfer path 55 of the solid state image pickup device, for example, a p-type well 72 is formed in the surface area of an n-type semiconductor substrate 71, and the n-type horizontal charge transfer channel 65 of a buried channel type is formed in the p-type well 72. In the horizontal charge transfer register 60, an n⁻-type region is formed in the horizontal charge transfer channel 65 under the region between adjacent charge accumulation electrodes 62, the n⁻-type region forming a potential barrier for presenting a reverse flow of charges. The charge accumulation electrode 62 and charge transfer electrode 63 are formed on an insulating film 74 on the horizontal charge transfer channel 65, and are interconnected in common at each transfer stage 64. In the output gate 61, an output gate electrode 75 is disposed above the horizontal charge transfer channel 65.

In the output region 57, the floating diffusion region 66 is formed as an $n^{++}$-type, the reset gate 68 is formed as an n-type, and the reset drain region 69 is formed as an $n^{++}$-type. The reset gate electrode 67 is formed on an insulating film 74 on the reset gate 68.

The charge accumulation electrode 62, charge transfer electrode 63, output gate electrode 75 and reset gate electrode 67 are made of polysilicon or amorphous silicon.

In this specification and drawings, an n-type channel region having a reduced effective impurity concentration because of p-type impurity doping is denoted by a symbol $n^-$, an n-type channel region having an increased effective impurity concentration because of n-type impurity doping is denoted by a symbol $n^+$, an n-type channel region having an increased effective impurity concentration higher than $n^+$ is denoted by a symbol $n^{++}$, and a p-type region having an increased impurity concentration because of p-type impurity doping is denoted by a symbol $p^+$.

As described above, the horizontal charge transfer channel 65 has the structure that the width thereof is gradually narrowed toward the output region 57, and the electrode gate length (length in the Y-direction) of the last transfer stage 64 of the horizontal charge transfer register 60 and the length of the output gate electrode 75 are set longer. Accordingly, a forward potential gradient is hard to be formed at the last transfer stage 64 of the horizontal charge transfer register 60, so that the charge transfer speed lowers and the transfer efficiency lowers.

In order to improve the transfer efficiency, it has been proposed that the opposite end portions, in the horizontal charge transfer channel width direction, of the electrode of the output gate 61 and the electrode of the last transfer stage of the horizontal charge transfer register 60, are bent toward the floating diffusion region side (for example, refer to Japanese Patent Laid-open Publication No. HEI-10-335635).

SUMMARY OF THE INVENTION

An object of this invention is to provide a solid state image pickup device having an improved charge transfer efficiency of the horizontal charge transfer path.

According to one aspect of the present invention, there is provided a solid state image pickup device comprising: a semiconductor substrate having a surface layer of a first conductivity type; a plurality of charge storage regions of a second conductivity type opposite to the first conductivity type disposed in the surface layer in a row and column matrix shape, constituting a plurality of photoelectric conversion elements; a plurality of vertical channels of the second conductivity type disposed in the surface layer adjacent to respective columns of the charge storage regions; vertical transfer electrodes formed above the semiconductor substrate, crossing the vertical channels, constituting vertical charge coupled devices; a horizontal channel of the second conductivity type disposed in the surface layer coupled to the vertical channels, having a first portion with a plurality of transfer stages, each including a barrier region and a well region, and a second portion constituting a gate region with gradually decreasing width, and including an upstream region and a downstream region of different effective impurity concentration, establishing a built-in potential; horizontal transfer electrodes disposed above respective transfer stages of the horizontal channel; an output gate electrode disposed above the gate region; a floating diffusion region of the second conductivity type disposed in the surface layer coupled to the gate region of the horizontal channel, constituting an output element for receiving a signal charge and outputting a voltage signal.

The solid state image pickup device has preferably an impurity doped region for forming the built-in potential in the channel under the last stage electrode of the horizontal charge transfer register.

The built-in potential forms a drift electric field which accelerates electric charges toward the output side.

As above, it is possible to provided a solid state image pickup device having an improved charge transfer efficiency of the horizontal charge transfer path.

BRIEF DESCRIPTION OF THE DRAWINGS

FIG. 2 is a graph showing simulation results of the potential comparison between a conventional solid state image pickup device and the first embodiment solid state image pickup device, when voltages are applied to the electrodes of the horizontal charge transfer paths and output region.

FIG. 3 is a graph showing simulation results of the comparison, between the conventional solid state image pickup device and the first embodiment solid state image pickup device, of the signal charge transfer time from the last transfer stage of the horizontal charge transfer resister to the floating diffusion region.

DESCRIPTION OF THE PREFERRED EMBODIMENTS

Figure 1A:
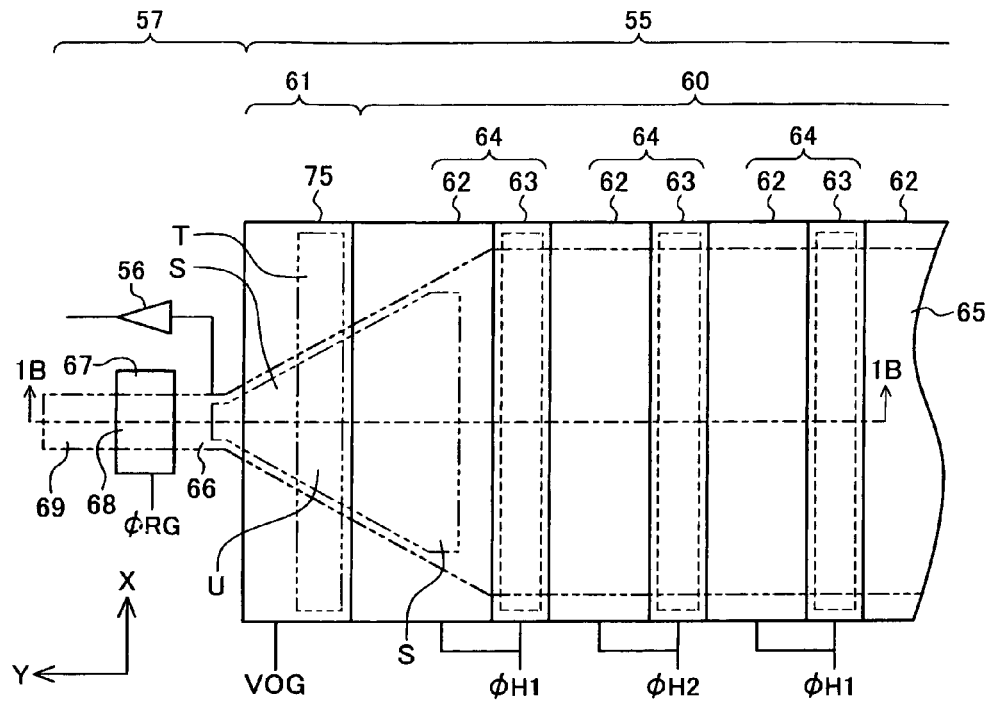
FIG. 1A is a schematic plan view showing the structure of a horizontal charge transfer path and an output region of a solid state image pickup device according to a first embodiment.
Figure 1B:
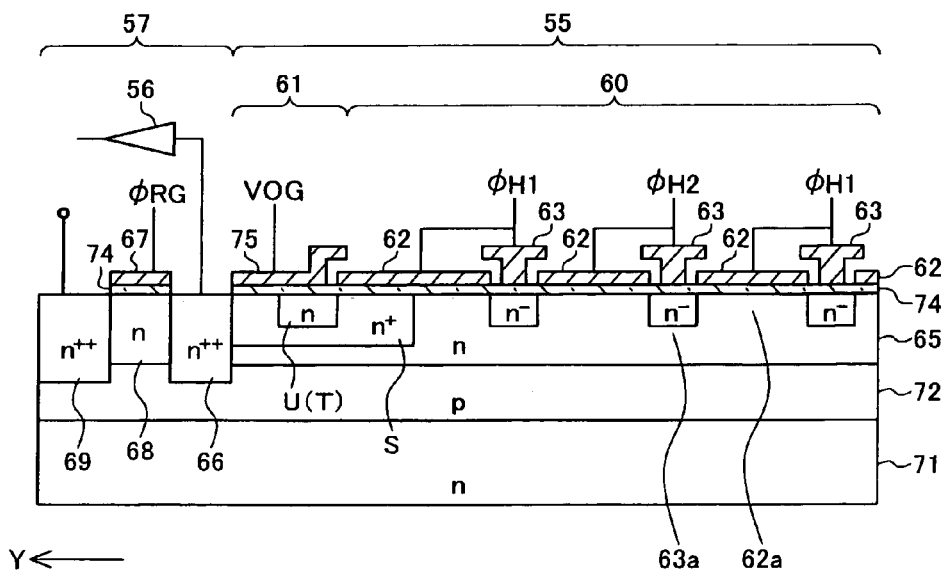
FIG. 1B is a cross sectional view taken along line 1B—1B shown in FIG. 1A.

FIG. 1A is a schematic plan view showing the structure of a horizontal charge transfer path 55 and an output region 57 of a solid state image pickup device according to the first embodiment, and FIG. 1B is a cross sectional view taken along line 1B—1B shown in FIG. 1A. The solid state image pickup device has the plan structure shown in FIG. 9.

Figure 9:
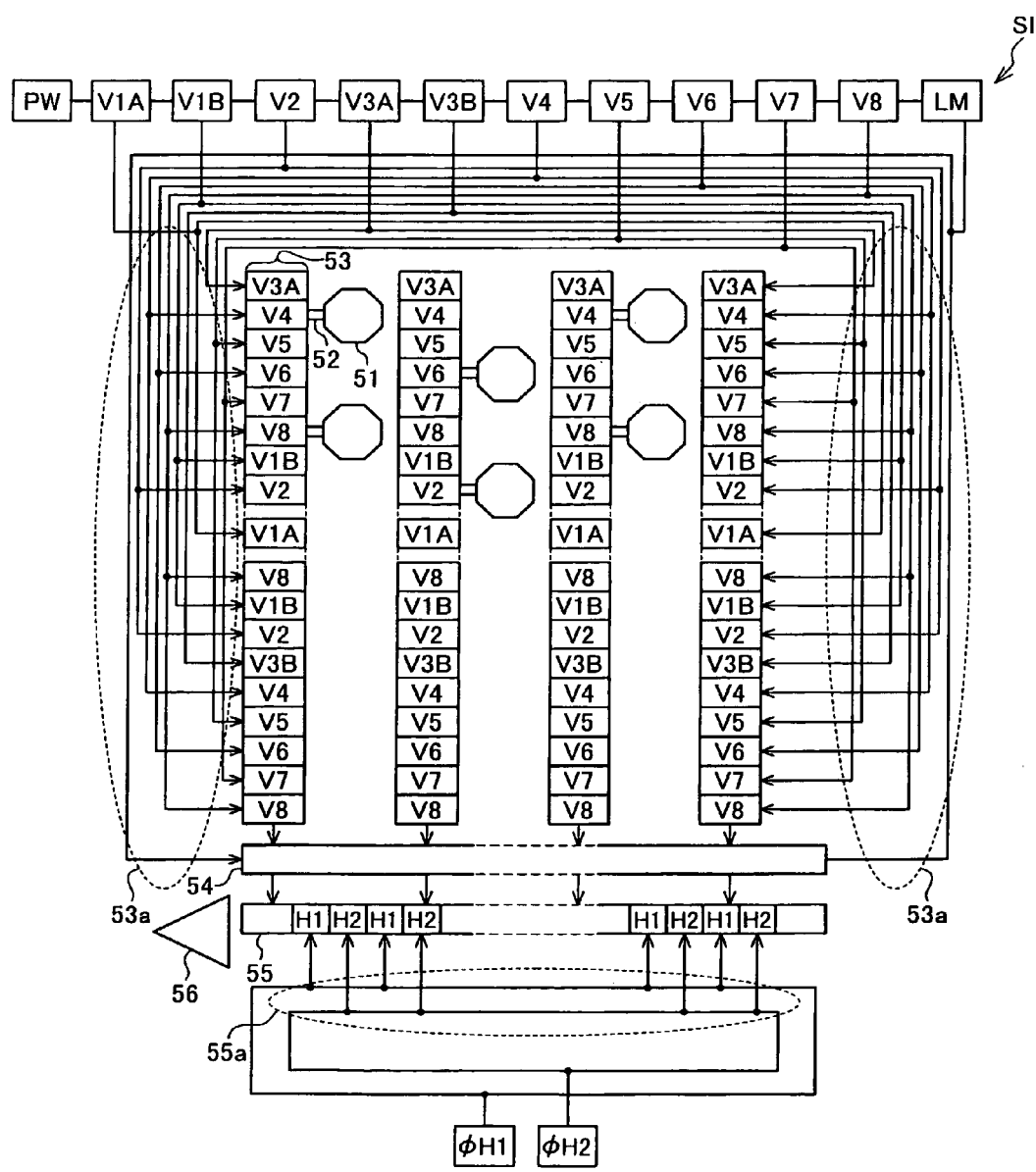
FIG. 9 is a plan view showing an outline of a solid state image pickup device.

The solid state image pickup device of the first embodiment is as shown in FIG. 9 constituted of: a plurality of photoelectric conversion elements 51 such as photodiodes disposed in a matrix shape; a plurality of vertical charge transfer paths 53 each disposed near each column of photoelectric conversion elements; read regions 52 for reading signal charges generated in the photoelectric conversion elements 51 to each associated vertical charge transfer path 53, a line memory 54 formed at one ends of the vertical charge transfer paths 53 in the area outside the light reception area; a horizontal charge transfer path 55 electrically coupled to one ends of the plurality of vertical charge transfer paths 53 via the line memory 54; and an output amplifier 56 formed at one end of the horizontal charge transfer path 53, respectively formed on a semiconductor substrate.

Figure 10A:
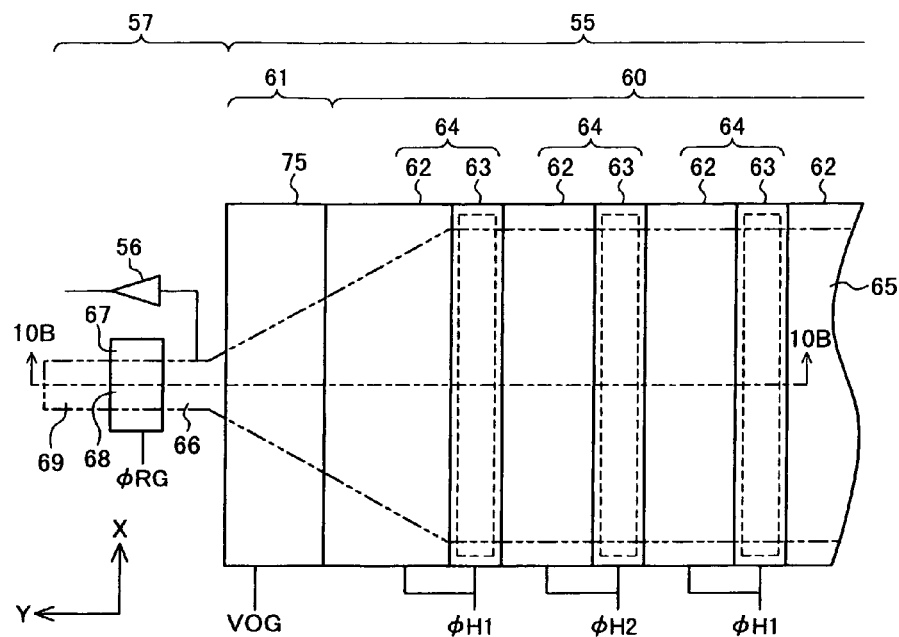
FIG. 10A is a schematic plan view showing the structure of a horizontal charge transfer path and an output region of a conventional solid state image pickup device.
Figure 10B:
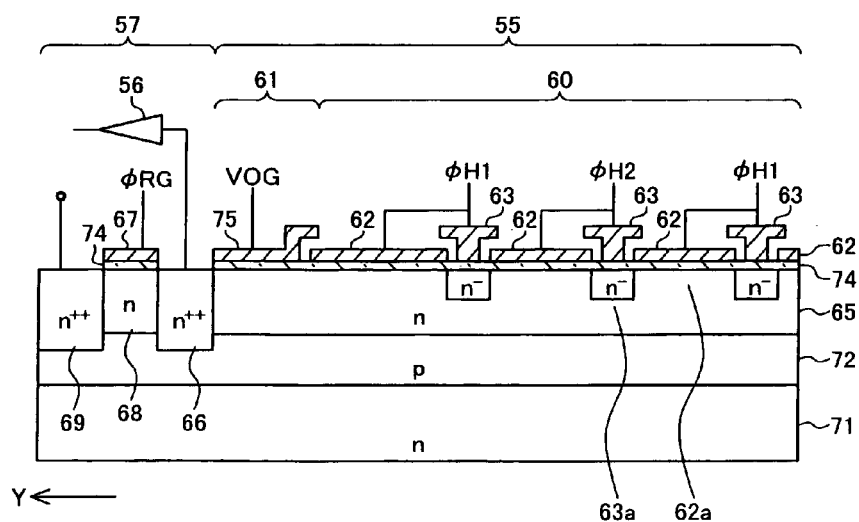
FIG. 10B is a cross sectional view taken along line 10B—10B shown in FIG. 10A.

The structures of the horizontal charge transfer path 55 and the output region 57 of the solid state image pickup device shown in FIGS. 1A and 1B are different from those shown in FIGS. 10A and 10B in that two impurity doped regions S and T are newly formed.

As shown in FIG. 1A, the impurity doped region S is a region surrounded by a three-dot chain line in FIG. 1A, and the impurity doped region T is a region surrounded by a four-dot chain line. The impurity doped region S is doped with impurities of the same conductivity type as that of the horizontal charge transfer path 65, and the impurity doped region T is a region doped with impurities of the opposite conductivity type to that of the horizontal charge transfer path 65.

For example, the $n^+$-type region S doped with n-type impurities of the same conductivity type as that of the n-type channel 65 has a potential lower than that of the channel, relative to electrons operating as the charge carrier. Carriers near the $n$-$n^+$ junction move and a drift electric field is formed which accelerates electrons from the n-type region toward the $n^+$-type region. In an overlapped region U, impurities of the conductivity type opposite to that of the channel are doped to compensate for the impurities of the same conductivity type as that of the channel. Therefore, as compared to the $n^+$-type region S, the effective impurity concentration of the region U lowers, the conductivity type changes to the n-type and the potential relative to electrons rises. Carriers near the junction between the region T and region S move, so that the drift electric field is formed. Although the drift electric field is also formed right to the region U, this drift electric field can be extinguished by controlling the potentials of the electrodes 62 and 75.

In the structure shown in FIG. 1A, the channel region 65 has the structure that the width (length in the X-direction) thereof is gradually narrowed from the last stage charge accumulation electrode 62 of the horizontal charge transfer register 60 toward the floating diffusion region 66. If the region under the electrode 62 has a uniform impurity concentration, it can be presumed that the resistance against the charge transfer increases as the width becomes narrow. By forming the $n^+$-n junction in the intermediate region to form the drift electric field, transferring carriers toward the output end is expected to be enhanced. Also in the region under the output gate electrode 75, the drift electric field is formed and transferring carriers toward the output end is expected to be enhanced.

In order to realize this function, impurities of the same conductivity type of the channel are doped in the underlying region from the center of the last stage charge accumulation electrode 62 to the downstream end thereof. If the n-type impurity doped region S is not formed under the output gate electrode 75, the $n^+$-type barrier region is formed on the upstream side and the n-type well region is formed on the downstream side. The impurity doped region S is formed in the region which includes at least a portion of the channel of the output gate 61 on the output region 57 side and a portion of the channel of the horizontal charge transfer register 60 under the last electrode on the output gate 61 side. In FIG. 1A, although the impurity doped region S is shown entering the floating diffusion region 66, it is sufficient if the impurity doped region S reaches the side of the floating diffusion region 66, and it is not necessary that the impurity doped region S positively enters the floating diffusion region 66. For example, the impurity doped region S is formed in the channel, as viewed in plan, in the range from the end of the output gate 61 on the output region 57 side to the intermediate position, e.g., a center position, in the electrode longitudinal direction (Y-direction) of the charge accumulation electrode 62 at the last stage of the horizontal charge transfer register 60. The region S is formed at least in the output gate 61 in such a manner that the width thereof is gradually narrowed toward the output region 57 (along the Y-direction) in the horizontal charge transfer channel 65. By forming the impurity doped region S, the effective impurity concentration distribution is formed in the channel under the charge accumulation electrode 62 at the last stage of the horizontal charge transfer register 60, and a potential difference potential well) is formed in the channel under the electrode 62.

The impurity doped region T is formed in a portion of the channel of the output gate 61 on the horizontal charge transfer register 60 side. For example, the impurity doped region T is formed in a stripe shape, e.g., a rectangular shape, traversing the horizontal charge transfer channel 65, as viewed in plan in the range from the end of the output gate 61 on the horizontal charge transfer register 60 side to the intermediate position, e.g., a center position, of the output gate electrode 75 in the electrode longitudinal direction (Y-direction).

The two impurity doped regions S and T have the overlapped region U in the horizontal charge transfer channel 65, for example, in the range from the border between the horizontal charge transfer register 60 and output gate 61 along the Y-direction to the center position of the output gate electrode 75 in the electrode longitudinal direction. The overlapped region U of the two impurity doped regions S and T is formed by doping impurities of the same and opposite conductivity types. The impurity concentrations are cancelled out and a potential barrier is formed.

The n-type region U and $n^+$-type region S form the effective impurity concentration distribution and potential difference in the channel of the output gate 61. Along the direction from the n-type region U toward the $n^+$-type region S on the floating diffusion 66 side, the drift electric field is formed so that transfer of carriers is enhanced. Also under the last stage charge accumulation electrode 62, a potential difference is formed by the n-type region 65 and $n^+$-type region S so that the drift electric field is formed accelerating carriers toward the downstream side.

As shown in FIG. 1B, if the horizontal charge transfer channel 65 is made of n-type semiconductor, the impurity doped region S is formed by doping n-type impurities into the horizontal charge transfer channel 65. The impurity doped region S has therefore the n$^+$-type. The impurity doped region T is formed by doping p-type impurities. The doses of impurities doped into the impurity doped regions S and T are, for example, equal. The impurity doped region T outside the horizontal charge transfer channel 65 is the p$^+$-type. The impurity doped region T (overlapped region U) in the horizontal charge transfer channel 65 is the n-type. The impurity doped region S is formed in the horizontal charge transfer channel down to a deep position, whereas the impurity doped region T is formed down to a shallower position. In the cross sectional view shown in FIG. 1B, the overlapped region U is shown in the inside of the impurity doped region S in the horizontal charge transfer channel 65.

FIG. 2 is a graph showing simulation results of the potential comparison between a conventional solid state image pickup device and the first embodiment solid state image pickup device, when voltages are applied to the electrodes of the horizontal charge transfer paths 55 and output region 57. The abscissa represents a distance in the unit of "μm" along the minus Y-direction from the standard point in the floating diffusion regions 66 shown in the cross sectional views shown in FIGS. 1B and 10B. The ordinates represents a potential in the unit of "V". A solid line p indicates a potential distribution, along the charge transfer path direction, of the horizontal charge transfer path 55 and output region 57 of the first embodiment solid state image pickup device shown in FIGS. 1A and 1B. A dotted line c indicates the corresponding potential distribution of the horizontal charge transfer path 55 and output region 57 of the conventional solid state image pickup device shown in FIGS. 10A and 10B.

The simulations were conducted under the conditions that 0 V was applied to the charge accumulation electrode 62 at the last stage and 4.3 V was applied to the output gate electrode 75. In both the conventional and first embodiment solid state image pickup devices, the output gate electrode 75 is positioned in the abscissa value range from 1.0 to 3.5, the charge accumulation electrode 62 at the last stage is positioned in the abscissa value range from 3.5 to 7.0, and the charge transfer electrode 63 at the last stage is positioned in the range from 7.0 to 8.0.

It can be seen from the graph that the first embodiment solid state image pickup device has a flat potential region smaller than that of the conventional solid state image pickup device, under the output gate electrode 75 and the charge accumulation electrode 62 at the last stage, and that the overall potential gradient rises and the drift electric field is formed. Since the drift electric field is formed along the charge transfer direction, signal charges can be transferred at high speed. The amount of signal charges not transferred is also reduced. The built-in potential due to the impurity concentration difference near at the interface between the electrodes 75 and 62 is extinguished.

FIG. 3 is a graph showing simulation results of the comparison, between the conventional solid state image pickup device and the first embodiment solid state image pickup device, of the signal charge transfer time from the last transfer stage 64 of the horizontal charge transfer register 60 to the floating diffusion region 66. The abscissa represents a position in the last stage 64 in the channel width direction as measured by the distance (in the unit of "μm") from the center of the horizontal charge transfer channel 65 in the X-direction. The ordinate represents a transfer time in the unit of "ns" of signal charges taken to transfer to the floating diffusion region 66. A solid line p indicates the characteristics of the first embodiment solid state image pickup device, and a dotted line c indicates the characteristics of the conventional solid state image pickup device. Simulation was conducted by applying 0 V to the charge accumulation electrode 62 at the last stage and 4.3 V to the output gate 75.

At the channel center position, signal charges can reach the floating diffusion region 66 only by transferring the signal charges along the electrode longitudinal direction (Y-direction) by the potential gradient. At an X position remote from the channel center position more than a half of the width of the floating diffusion region 66, signal charges cannot reach the floating diffusion region 66 if only the Y-direction transfer is used, and the X-direction transfer is additionally required. This may lead to that the transfer time becomes longer as the X position comes nearer to the end of the channel width, both in the two graphs p and c.

In the curve p, the transfer time prolongs in approximate proportion with the distance from the center position of the horizontal transfer channel 65. In the curve c, the increase rate of the charge transfer time becomes large along the direction from the center position of the horizontal charge transfer channel 65 to the end of the width thereof. As compared with the conventional curve c, the curve p of the first embodiment solid state image pickup device shows not only the signal charge transfer time from the center position of the horizontal charge transfer channel 65 to the floating diffusion region 66 is shortened, but also the signal charge transfer time is shortened at a larger rate at the position nearer to the end of the width of the horizontal charge transfer channel 65. Since the overall charge transfer time is governed by the longest transfer time, the signal charge transfer time (transfer efficiency) of the first embodiment solid state image pickup device is improved far more than that of the conventional solid state image pickup device.

Improvement on the signal charge transfer time of the first embodiment solid state image pickup device may be ascribed to that the potential flat portion is reduced and the total potential gradient becomes sharp, under the output gate electrode 75 and the charge accumulation electrode 62 at the last stage. This can be considered that the two impurity doped regions S and T form built-in potentials under the last stage electrode 62 of the horizontal charge transfer register 60 and the output gate electrode 75 along the direction of enhancing the signal charge transfer.

Figure 4A:
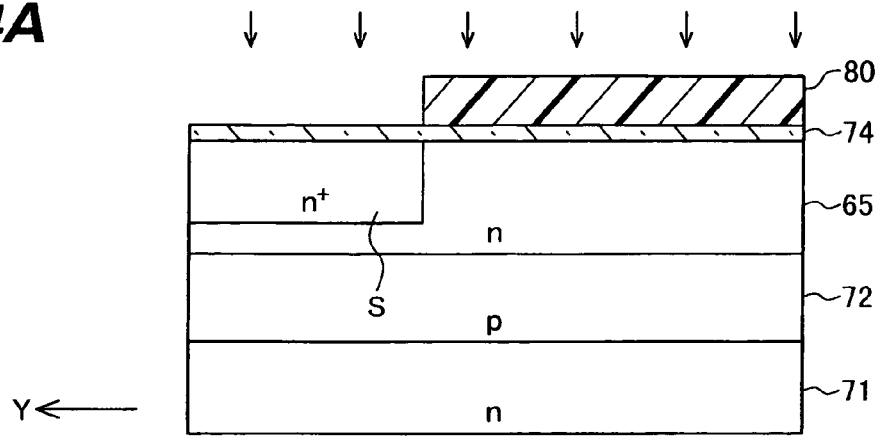
FIGS. 4A to 4C are schematic cross sectional views illustrating the manufacture method for the output gate and the nearby region of the last transfer stage of the first embodiment solid state image pickup device.
Figure 4B:
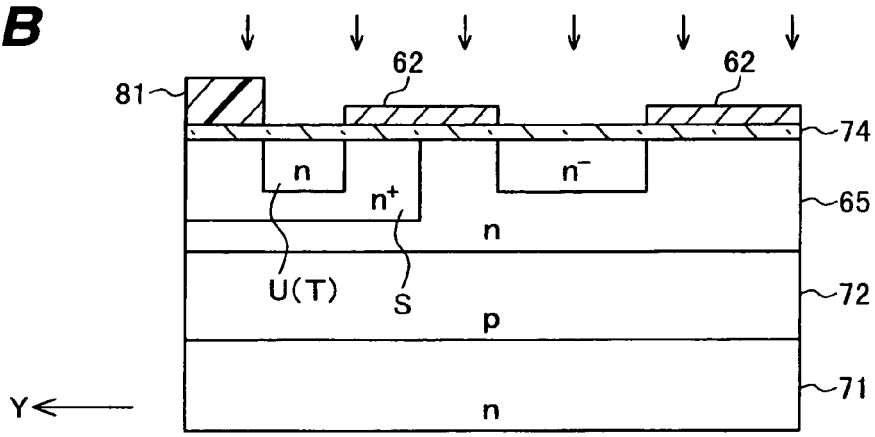
Figure 4C:
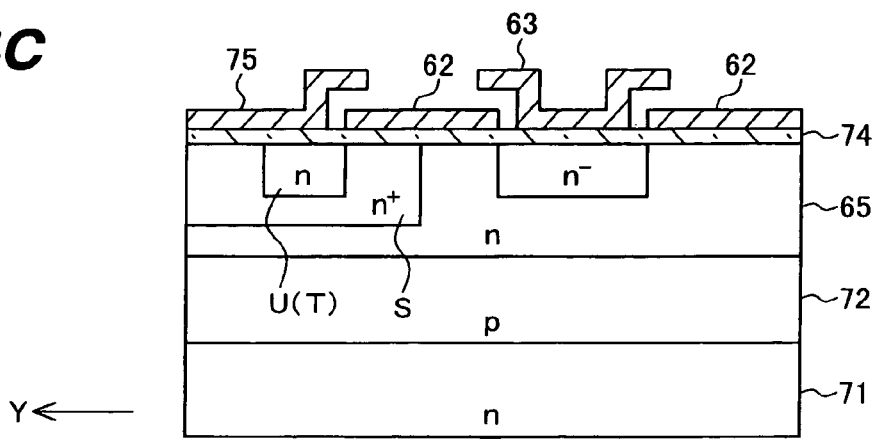

FIGS. 4A to 4C are schematic cross sectional views illustrating the manufacture method for the output gate 61 and the nearby region of the last transfer stage 64 of the first embodiment solid state image pickup device.

As shown in FIG. 4A, a p-type well 72 is formed in an n-type semiconductor substrate 71, for example, by ion implantation. An n-type horizontal charge transfer channel 65 is formed in the p-type well 72, for example, by ion implantation. An insulating film 74 such as an ONO film is formed on the horizontal charge transfer channel 65. These processes are similar to prior art processes.

A partial area of the insulating film 74 on the horizontal charge transfer channel 65 is covered with a resist layer 80. n-type impurities, e.g., phosphorous ions, are implanted under the conditions of, for example, an acceleration energy 80 to 150 keV and a dose $5\times10^{11}$ cm$^{-2}$. An n$^+$-type impurity doped region S is therefore selectively formed in the horizontal charge transfer channel 65. Arsenic may be used as the n-type impurities.

As shown in FIG. 4B, after the resist layer 80 is removed, an electrode layer of polysilicon is deposited on the insulating film 74 on the horizontal charge transfer channel 65 and patterned to form charge accumulation electrodes 62. The charge accumulation electrode 62 is formed covering the one end of the impurity doped region S, for example, by aligning the center of the charge accumulation electrode 62 with the end of the impurity doped region S along the longitudinal direction (Y-direction) of the charge accumulation electrode 62.

A partial area of the insulating film 74 on the impurity doped region S on the downstream side is covered with a resist layer 81. By using the resist layer 81 and charge accumulation electrodes 62 as a mask, p-type impurities such as boron ions are implanted under the conditions of an acceleration energy 40 to 80 keV and a dose $5 \times 10^{11}$ cm$^{-2}$. By the compensation of the opposite conductivity type impurities, an n$^-$-type region is formed between adjacent charge accumulation electrodes 62. In the n$^+$-type impurity doped region S in the horizontal charge transfer channel 65, an n-type overlapped region U is formed in the region between the resist layer 81 and last stage charge accumulation electrode 62. The potential relative to electrons becomes lower in the order of n$^-$-type, n-type and n$^+$-type. In the p-type region outside the horizontal charge transfer channel 65, a p$^+$-type impurity doped region T is formed.

As shown in FIG. 4C, after the resist layer 81 is removed, the surfaces of the charge accumulation electrodes 62 are oxidized and then an electrode layer of polysilicon is deposited on the substrate and patterned to form charge transfer electrodes 63 on the insulating film 74 on the n$^-$-type regions, and to form an output gate electrode 75 on the insulating film 74 on the impurity doped region S including the impurity doped region T (overlapped region U). The output gate electrode 75 is formed extending the area from above the overlapped region U to the downstream impurity doped region S, for example, by aligning the center of the output gate electrode 75 with the downstream end of the impurity doped region T (overlapped region U) along the longitudinal direction (Y-direction) of the output gate electrode 75.

In the first embodiment, the channel region under the gate electrode 75 of the output gate 61 is constituted of a barrier region made of the n-type region U and a well region made of the n$^+$-type region S. Since the barrier region is of the n-type, the absolute value of the output gate voltage VOG is required to be larger than that of the charge transfer electrode of the charge transfer register 60 having the n$^-$-type barrier, in order to turn off the output gate.

Figure 5A:
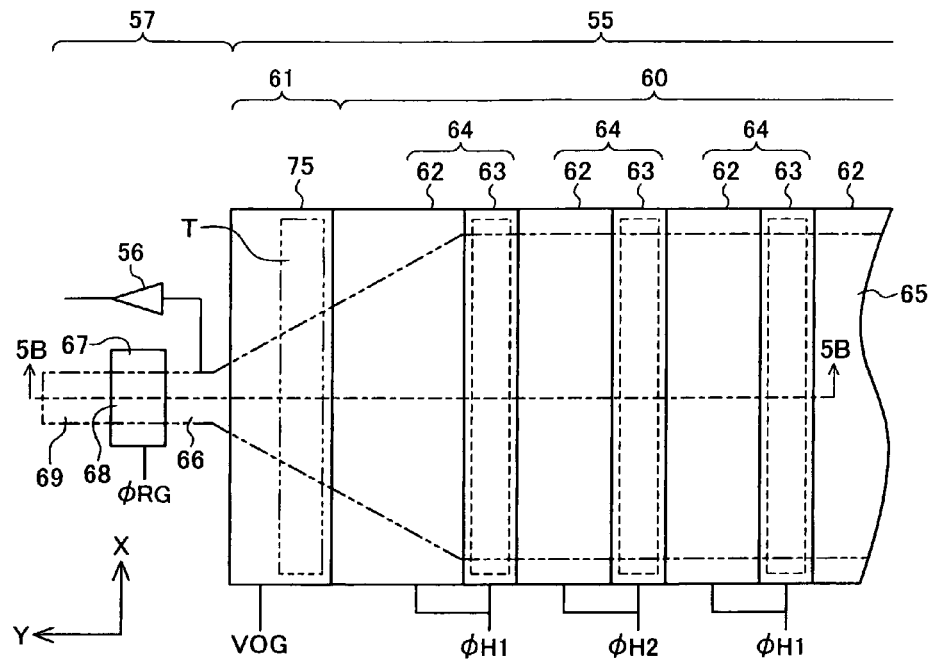
FIGS. 5A is a schematic plan view showing the structure of a horizontal charge transfer path and an output region of a solid state image pickup device according to a second embodiment.
Figure 5B:
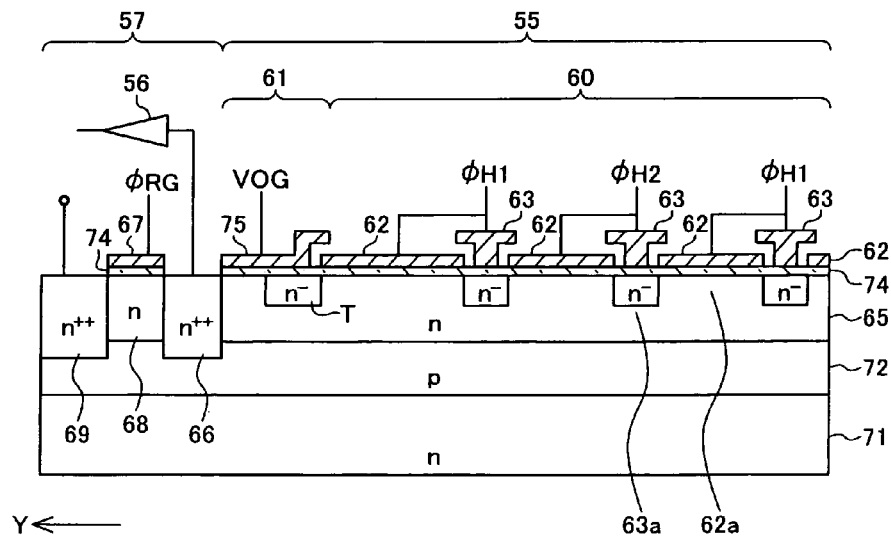
FIG. 5B is a cross sectional view taken along line 5B—5B shown in FIG. 5A.

FIG. 5A is a schematic plan view showing the structure of a horizontal charge transfer path 55 and an output region 57 of a solid state image pickup device according to the second embodiment, and FIG. 5B is a cross sectional view taken along line 5B—5B shown in FIG. 5A. In the solid state image pickup device of the second embodiment, the impurity doped region T is formed and the impurity doped region S is not formed, in the horizontal charge transfer path 55 of the conventional solid state image pickup device shown in FIGS. 10A and 10B. The solid state image pickup device of the second embodiment is different from the first embodiment in that the impurity doped region S is not formed.

As shown in FIG. 5A, the impurity doped region T is the region in which impurities of the conductivity type opposite to that of the horizontal charge transfer channel 65 were doped, and is shown surrounded by a four-dot chain line. Impurities are doped into regions similar to those of the first embodiment. By forming the impurity doped region T, a built-in potential can be formed in the channel under the output gate electrode 75 where the channel width becomes narrowest and a sharp potential gradient can be formed. Although an impurity concentration distribution is not formed under the last charge accumulation electrode 62, the manufacture process shown in FIG. 4A can be omitted and the number of masks can be reduced by "1".

As shown in FIG. 5B, if the horizontal charge transfer channel 65 is made of n-type semiconductor, the impurity doped region T is formed by doping p-type impurities. The impurity doped region T has therefore the n$^-$-type in the n-type horizontal charge transfer channel 65 to form a potential barrier. In the p-type region outside the horizontal charge transfer channel 65, a p$^+$-type region is formed.

The channel region under the output gate electrode 75 is constituted of the n$^-$-type impurity doped region T and the n-type horizontal charge transfer channel 65. Since the barrier has the n$^-$-type, the voltage necessary for turning off the output gate is smaller than that of the first embodiment.

Also for the solid state image pickup device of the second embodiment, it has been found from the experiments that a transfer time of signal charges from the last stage 64 to the floating diffusion region 66 is shortened. This may be ascribed to that the impurity doped region T forms a potential difference under the output gate electrode 75 and a sharp potential gradient (a sharp overall potential gradient). Also in the solid state image pickup device of the second embodiment, a charge transfer time in the horizontal charge transfer path 55 can be improved.

The solid state image pickup device of the second embodiment can be manufactured by omitting the process of forming the resist layer 80 and implanting n-type impurities (forming the impurity doped region S) shown in FIG. 4A, from the manufacture processes for the solid state image pickup device of the first embodiment shown in FIGS. 4A to 4C. Since the impurity doped region S is not formed, position alignment of the last charge accumulation electrode 62 described with reference to FIG. 4B is not necessary.

Figure 6:
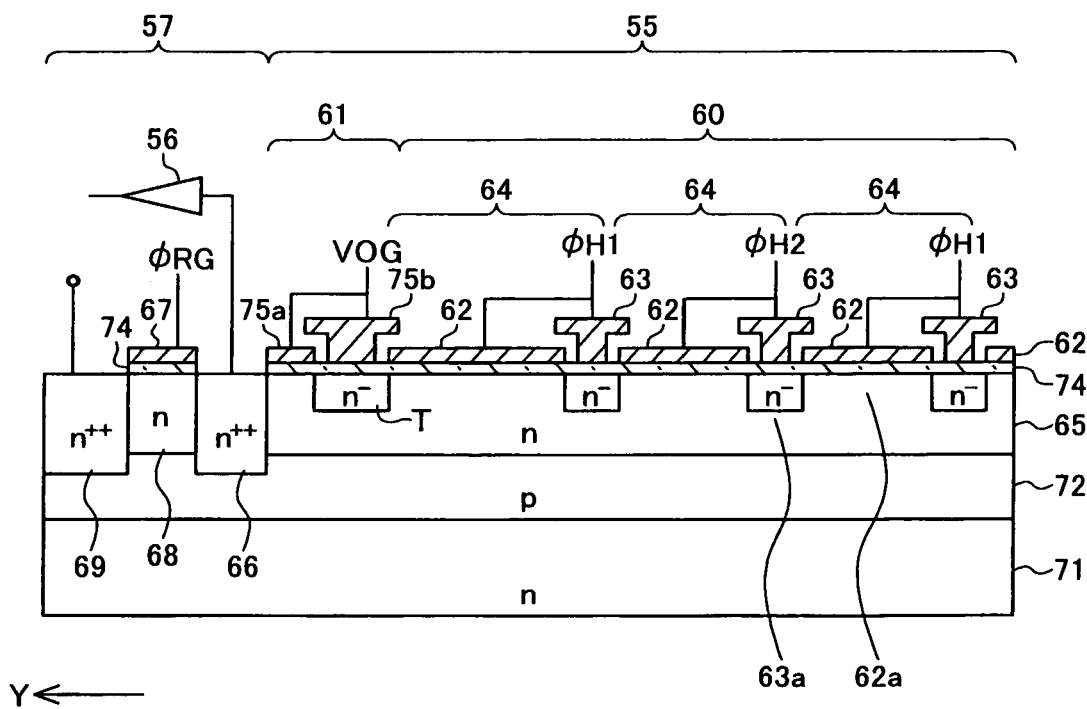
FIG. 6 is a schematic cross sectional view showing the structure of a horizontal charge transfer path and an output region of a solid state image pickup device according to a third embodiment.

FIG. 6 is a schematic plan view showing the structure of a horizontal charge transfer path 55 and an output region 57 of a solid state image pickup device according to the third embodiment. The different point from the solid state image pickup device of the second embodiment shown in FIGS. 5A and 5B resides in that the output gate electrode 75 is divided into output gate electrodes 75a and 75b which are connected in common and applied with the voltage VOG. The other structures are similar to those of the second embodiment. In the solid state image pickup device of the third embodiment, the first-layer output gate electrode 75a is formed when the charge accumulation electrodes 62 are formed, and the impurity doped region T is formed therebetween in the horizontal charge transfer channel 65. The second-layer output gate electrode 75b is formed on the insulating film 74 on the impurity doped region T. The alignment precision of the mask 81 shown in FIG. 4B can be relaxed.

Figure 7A:
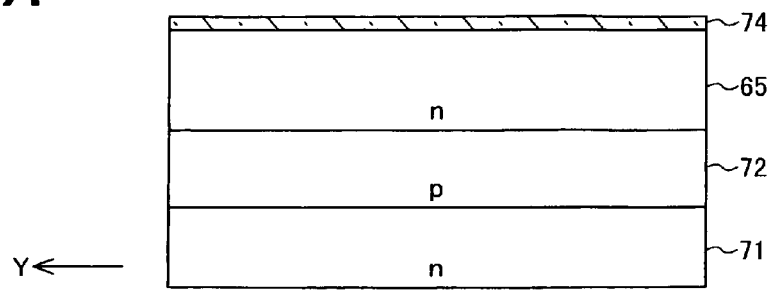
FIGS. 7A to 7C are schematic cross sectional views illustrating the manufacture method for the output gate and the nearby region of the last transfer stage of the third embodiment solid state image pickup device.
Figure 7B:
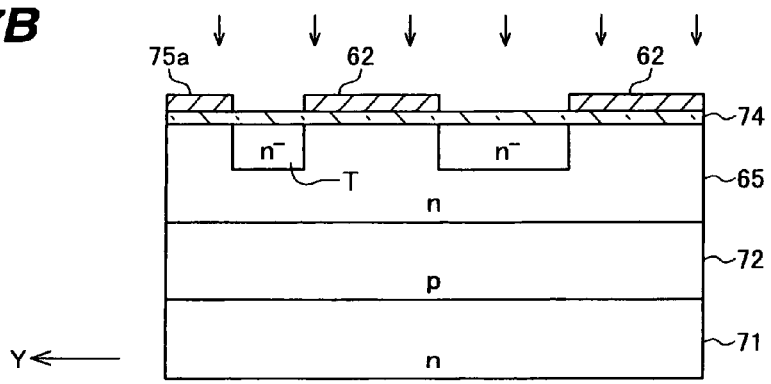
Figure 7C:
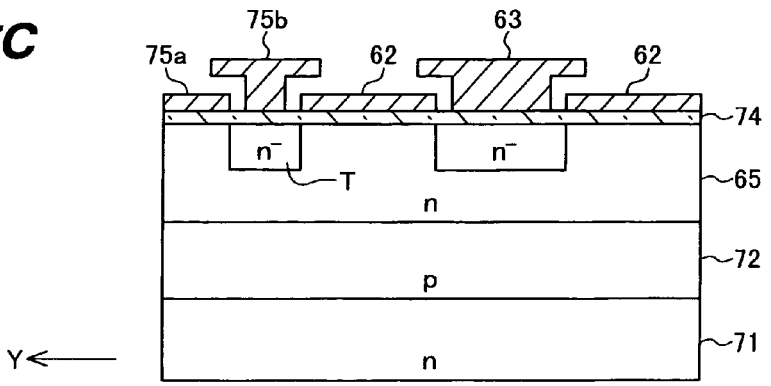

FIGS. 7A to 7C are schematic cross sectional views illustrating the manufacture method for the output gate 61 and the nearby region of the last transfer stage 64 of the third embodiment solid state image pickup device.

As shown in FIG. 7A, a p-type well 72 is formed in an n-type semiconductor substrate 71, for example, by ion implantation. An n-type horizontal charge transfer channel 65 is formed in the p-type well 72 and an insulating film 74 is formed on the horizontal charge transfer channel 65.

As shown in FIG. 7B, an electrode layer of polysilicon is deposited on the insulating film 74 on the horizontal charge transfer channel 65 and patterned to form charge accumulation electrodes 62 and a first-layer output gate electrode 75a.

By using the charge accumulation electrodes 62 and the first-layer output gate electrode 75a as a mask, p-type impurities, e.g., boron ions, are implanted under the conditions of an acceleration energy 40 to 80 keV and a dose $5 \times 10^{11}$ cm$^{-2}$. n$^-$-type regions are therefore formed in the horizontal charge transfer channel 65 between the adjacent charge accumulation electrodes 62 and between the last stage charge accumulation electrode 62 and the first-layer output gate electrode 75a. The latter n$^-$-type region is the impurity doped region T. A mask similar to the resist mask 81 shown in FIG. 4B covers the regions where the electrodes 62 and 75a don't exist and ion implantation is not performed.

As shown in FIG. 7C, the surfaces of the charge accumulation electrodes 62 and the first-layer output gate electrode 75a are oxidized. Thereafter, an electrode layer of polysilicon is deposited and patterned to form the charge transfer electrodes 63 and a second-layer output gate electrode 75b on the insulation film 74 on the n$^-$-type regions.

As compared to the manufacture method for the solid state image pickup device of the second embodiment, the manufacture method for the solid state image pickup device of the third embodiment can relax the alignment precision of the output gate electrode 75 without increasing the number of processes.

In the above embodiments, the positions and shapes of the impurity doped regions S and T are not limited only to those of the first and second embodiments. Other positions and shapes may be adopted if impurities are doped so that the potential difference enhancing the signal charge transfer is formed and a sharp potential gradient (sharp total potential gradient) is formed.

In the above-described embodiments, the conductivity type of all the regions may be reversed. A charge transfer time in the horizontal charge transfer path 55 can be improved by doping impurities into the impurity doped region S and/or T.

Figure 8:
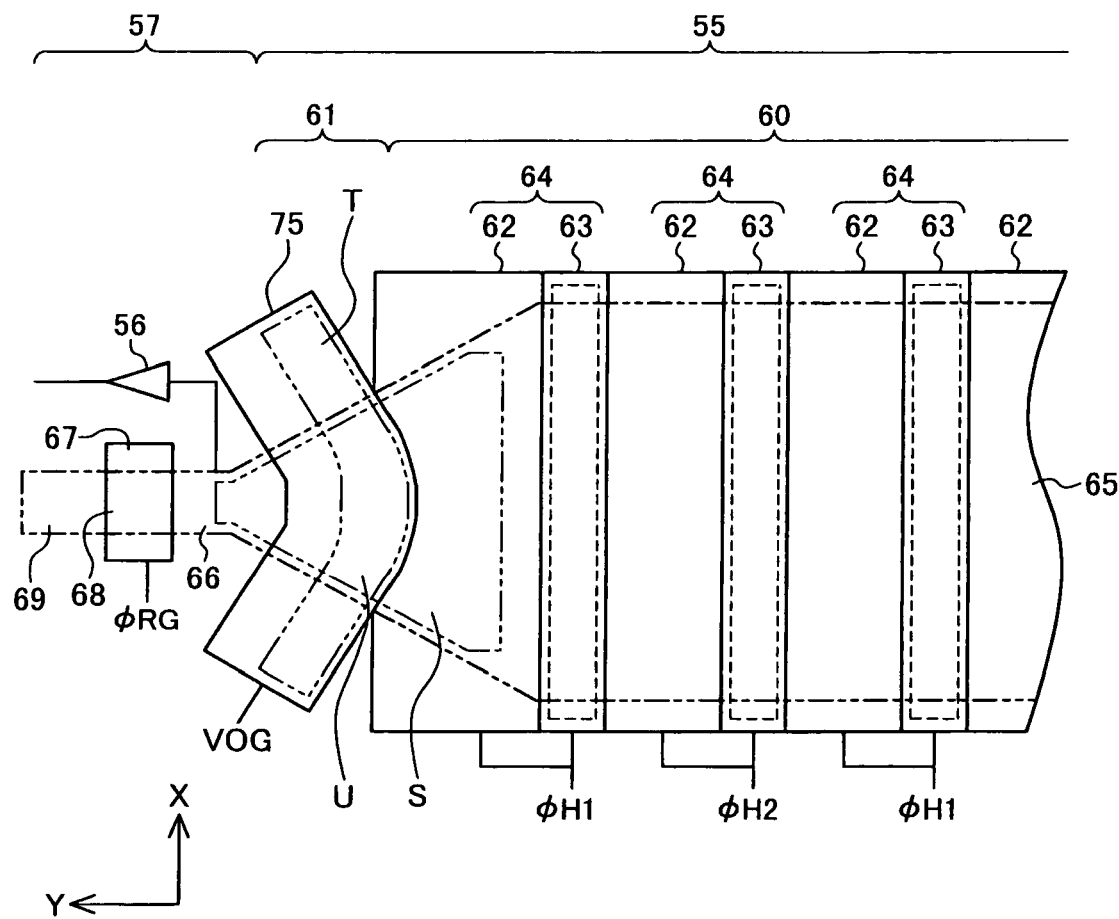
FIG. 8 is a schematic plan view of a solid state image pickup device according to a modification.

FIG. 8 is a schematic plan view of a solid state image pickup device according to a modification. As compared to the solid state image pickup device shown in FIG. 1, the opposite end portions of the output gate 75 along the width direction of the horizontal charge transfer channel 65 are bent toward the floating diffusion region 66 to change the electric field direction. The impurity doped region T is bent surrounding the floating diffusion region 66 as viewed in plan. In the solid state image pickup device shown in FIG. 8, the impurity doped regions S and T form a built-in potential enhancing the signal charge transfer in the horizontal charge transfer channel 65, and the bent output gate electrode 75 directs the electric field toward the floating diffusion region 66. It is therefore possible to smooth the signal charge transfer and shorten the signal charge transfer time.

The present invention has been described in connection with the preferred embodiments. The invention is not limited only to the above embodiments. It will be apparent to those skilled in the art that other various modifications, improvements, combinations, and the like can be made.

We claim:

1. A solid state image pickup device comprising:
   a semiconductor substrate of a second conductivity type and having a surface layer of a first conductivity type opposite to said second conductivity type formed thereon;
   a plurality of charge storage regions of the second conductivity type disposed in said surface layer in a row and column matrix shape, constituting a plurality of photoelectric conversion elements;
   a plurality of vertical channels of the second conductivity type disposed in said surface layer adjacent to respective columns of said charge storage regions;
   vertical transfer electrodes formed above the semiconductor substrate, crossing said vertical channels, constituting vertical charge coupled devices;
   a horizontal channel of the second conductivity type disposed in said surface layer coupled to said vertical channels, having a first portion with a plurality of transfer stages, each including a barrier region and a well region, and a second portion constituting a gate region with gradually decreasing width, and including an upstream region and a downstream region of different effective impurity concentration, establishing a built-in potential;
   horizontal transfer electrodes disposed above respective transfer stages of said horizontal channel;
   an output gate electrode disposed above said gate region;
   a floating diffusion region of said second conductivity type disposed in said surface layer coupled to said gate region of said horizontal channel, constituting an output element for receiving a signal charge and outputting a voltage signal.

2. The solid state image pickup device according to claim 1, wherein the barrier region of said horizontal channel is doped with impurities of the first conductivity type.

3. The solid state image pickup device according to claim 2, wherein said upstream and downstream regions of different effective impurity concentration are formed by doping impurities of the first conductivity type into the upstream region.

4. The solid state image pickup device according to claim 3, wherein a concentration of the first conductivity type impurity in said barrier region is equal to a concentration of the first conductivity type impurity in the upstream region of said gate region.

5. The solid state image pickup device according to claim 4, wherein each of said horizontal transfer electrodes includes a first level silicon electrode disposed above the well region and a second level silicon electrode disposed above the barrier region.

6. The solid state image pickup device according to claim 5, wherein said output gate electrode includes: a first silicon electrode made of a same layer as the first level silicon electrode and disposed above a downstream region; and a second silicon gate electrode made of a same layer as the second level silicon electrode and disposed above the upstream region.

7. The solid state image pickup device according to claim 3, wherein the upstream region has a stripe shape.

8. The solid state image pickup device according to claim 7, wherein the stripe shape is bent to surround said floating diffusion region as viewed in plan.

9. The solid state image pickup device according to claim 1, wherein a last transfer stage of the first portion of said horizontal channel has a well region whose width narrows toward said gate region.

10. The solid state image pickup device according to claim 9, further comprising an impurity doped region doped with impurities of the second conductivity type disposed at a downstream portion of the last well region.

11. The solid state image pickup device according to claim 10, wherein the impurity doped region is formed by doping impurities of the second conductivity type in a region from an intermediate position to an output side end of the well region of the last transfer stage of said first portion.

12. The solid state image pickup device according to claim 11, wherein the impurity doped region and the downstream region are formed by doping impurities of the second conductivity type in a region from an intermediate position of the well region of the last transfer stage of said first portion to an output side end of said second portion of said horizontal channel.

13. The solid state image pickup device according to claim 12, wherein the barrier region of said first portion is doped with impurities of a first conductivity type.

14. The solid state image pickup device according to claim 12, wherein the built-in potential of said gate region is formed by doping impurities of the first conductivity type into the upstream region.

15. The solid state image pickup device according to claim 14, wherein a first conductivity type impurity concentration in the barrier region is equal to the first conductivity type impurity concentration in the upstream region of said gate region.

16. The solid state image pickup device according to claim 15, wherein said horizontal transfer electrodes of said horizontal charge coupled device includes a first level silicon electrode disposed above the well region and a second level silicon electrode disposed above the barrier region and riding above edge of the first level silicon electrode.

17. The solid state image pickup device according to claim 16, wherein said output gate electrode includes: a first silicon electrode made of a same layer as the first level silicon electrode and disposed above the downstream region; and a second silicon gate electrode made of a same layer as the second level silicon electrode and disposed above the upstream region.

18. The solid state image pickup device according to claim 14, wherein the upstream region has a stripe shape.

19. The solid state image pickup device according to claim 18, wherein the stripe shape is bent to surround said floating diffusion region as viewed in plan.

20. The solid state image pickup device according to claim 1, wherein the first conductivity type is p-type and the second conductivity type is n-type.

21. The solid state image pickup device according to claim 1, wherein the semiconductor substrate has the second conductivity type, and the semiconductor substrate, the surface layer and the charge storage regions constitute electronic shutter structure.

* * * * *